United States Patent
Deng et al.

(10) Patent No.: US 11,774,519 B2
(45) Date of Patent: Oct. 3, 2023

(54) SHIELDED SENSOR STRUCTURE AND METHOD OF MAKING SAME

(71) Applicant: Texas Instruments Incorporated, Dallas, TX (US)

(72) Inventors: Yong Deng, Stanford, CA (US); Jo Bito, Dallas, TX (US); Benjamin Stassen Cook, Los Gatos, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 159 days.

(21) Appl. No.: 17/003,693

(22) Filed: Aug. 26, 2020

(65) Prior Publication Data

US 2021/0063497 A1 Mar. 4, 2021

Related U.S. Application Data

(60) Provisional application No. 62/892,387, filed on Aug. 27, 2019.

(51) Int. Cl.
*G01R 33/00* (2006.01)
*G01R 33/07* (2006.01)
*H05K 9/00* (2006.01)

(52) U.S. Cl.
CPC ......... *G01R 33/0076* (2013.01); *G01R 33/07* (2013.01); *H05K 9/0045* (2013.01); *H05K 9/0075* (2013.01)

(58) Field of Classification Search
CPC ................ G01R 33/0076; G01R 33/07; G01R 33/0052; G01R 33/072; H05K 9/0045; H05K 9/0075

USPC .......................................................... 324/251
See application file for complete search history.

(56) References Cited

U.S. PATENT DOCUMENTS

| 6,307,258 | B1 * | 10/2001 | Crane, Jr. | ............. | H01L 23/057 |
| | | | | | 257/680 |
| 6,515,352 | B1 * | 2/2003 | Spielberger | .......... | G01R 33/025 |
| | | | | | 257/659 |
| 10,718,636 | B1 * | 7/2020 | Cox | ........................ | G01D 5/165 |
| 2005/0277231 | A1 * | 12/2005 | Hembree | ............ | H01L 27/1462 |
| | | | | | 438/126 |
| 2008/0116535 | A1 * | 5/2008 | Molla | ................... | H01L 23/552 |
| | | | | | 257/422 |

(Continued)

FOREIGN PATENT DOCUMENTS

| DE | 102018131306 A1 * | 8/2019 | ............. G01R 15/20 |
| EP | 3276365 A1 * | 1/2018 | ......... G01R 33/0011 |
| WO | WO-2004017102 A2 * | 2/2004 | ............. B82Y 35/00 |

OTHER PUBLICATIONS

LPKF Laser & Electronics; Active Mold Packaging (AMP) Technlogy—LPKF; https://www.lpkf.com/en/industries-technologies/active-mold-packaging/amp-technology; Printed—Aug. 26, 2020; 13 pgs.

(Continued)

*Primary Examiner* — Christopher P McAndrew
(74) *Attorney, Agent, or Firm* — Frank D. Cimino

(57) ABSTRACT

In a described example, a structure includes a substrate having a surface with multiple sides. A sensor is positioned within the substrate and a seed layer is over at least four sides of the surface of the substrate. A magnetic shield layer is over the seed layer for the at least four sides of the surface of the substrate.

27 Claims, 7 Drawing Sheets

(56) References Cited

U.S. PATENT DOCUMENTS

| | | | | |
|---|---|---|---|---|
| 2015/0028863 | A1* | 1/2015 | Zeyen | G01R 33/0011 29/602.1 |
| 2016/0091575 | A1* | 3/2016 | Yamada | G01R 33/0047 324/225 |
| 2016/0202329 | A1* | 7/2016 | Paci | G01R 33/093 324/252 |
| 2017/0033278 | A1* | 2/2017 | Lapicki | G01R 33/0017 |
| 2017/0123016 | A1* | 5/2017 | Deak | G01R 33/0011 |
| 2017/0212182 | A1* | 7/2017 | Hahn | G01R 33/60 |
| 2017/0251555 | A1* | 8/2017 | Sunshine | H01L 23/49805 |
| 2017/0288131 | A1* | 10/2017 | Sun | H10N 52/01 |
| 2018/0031645 | A1* | 2/2018 | Burssens | G01R 33/091 |
| 2018/0197821 | A1* | 7/2018 | Shin | H01L 21/565 |
| 2018/0218984 | A1* | 8/2018 | Van Der Wiel | H01L 23/552 |
| 2018/0331051 | A1* | 11/2018 | Dogiamis | H01L 23/66 |
| 2019/0377037 | A1* | 12/2019 | Wu | G01R 33/0052 |
| 2020/0174044 | A1* | 6/2020 | Liu | G01R 19/0092 |
| 2022/0163568 | A1* | 5/2022 | Legendre | H02K 11/215 |

OTHER PUBLICATIONS

Melexis Inspired Engineering; "MLX91216 High Speed Current Sensor IC"; Datasheet; Rev 001—Nov. 20, 2018; 13 Pgs.

Melexis Inspired Engineering; "MLX91210 Integrated Current Sensor IC"; Datasheet; Document: 3901091210; Revision 1—Jul. 20, 2016; 18 Pgs.

Allegro Microsystems; ACS758xCB; "Thermally Enhanced, Fully Integrated, Hall-Effect-Based Linear Current Sensor IC with 100 $\mu\Omega$ Current Conductor"; ACS758-DS, Rev. 16 MCO-0000203; Feb. 3, 2020; 22 Pgs.

Texas Instruments; "TMCS1100 1% High-Precision, Basic Isolation Hall-Effect Current Sensor With ±600-V Working Voltage"; SBOS820A—Sep. 2019—Revised Jun. 2020; 50 Pgs.

Jo Bito, "Magnetic Flux Concentrator for In-Plane Direction Magnetic Field Concentration"; U.S. Appl. No. 16/521,053, filed Jul. 24, 2019.

Jo Bito, "Magnetic Flux Concentrator for Out-of-Plane Direction Magnetic Field Concentration"; U.S. Appl. No. 16/565,130, filed Sep. 9, 2019.

* cited by examiner

SHIELDED SENSOR STRUCTURE AND METHOD OF MAKING SAME

RELATED APPLICATIONS

This application claims priority from U.S. Provisional Patent Application Ser. No. 62/892,387, filed Aug. 27, 2019, and entitled STRAY FIELD SHIELD WITH MULTI-LAYER MAGNETIC STRUCTURE FOR CURRENT SENSING, which is incorporated herein by reference in its entirety.

TECHNICAL FIELD

This description relates to a shielded sensor structure and to a method of making the shielded structure.

BACKGROUND

Various types of sensors have been developed to detect events or conditions and provide a sensor signal to indicate the detected event or condition. For example, a Hall effect sensor is configured to measure the magnitude of a magnetic field and to provide an output voltage that is proportional to the measured magnetic field strength. Hall effect sensors may be used for proximity sensing, positioning, speed detection, and current sensing applications. Stray magnetic fields, such as caused by power line or nearby electronics may degrade sensing accuracy for Hall and other types sensors that may be sensitive to magnetic fields. This is because sensors cannot differentiate the source of the contributing magnetic fields being measured.

SUMMARY

In a described example, a structure includes a substrate having a surface with multiple sides. A sensor is positioned within the substrate and a seed layer is over at least four sides of the surface of the substrate. A magnetic shield layer is over the seed layer for the at least four sides of the surface of the substrate.

In another example, a method for forming a structure includes providing a substrate comprising a surface having six sides, a sensor positioned within the substrate. The method also includes forming a seed layer over at least four sides of the surface of the substrate. The method also includes forming a magnetic shield layer over the seed layer for the at least four sides of the surface of the substrate.

DETAILED DESCRIPTION

Example embodiments relate to using a magnetic shield to reduce the effect of stray magnetic fields on a sensor. A structure, such as an IC package, includes one or more sensors within a substrate. One or more magnetic shield layers of a material having a high magnetic permeability (e.g., greater than approximately 100 $H \cdot m^{-1}$, such as ranging from about $10^2$-$10^5 H \cdot m^{-1}$) are formed over the structure on a set of outer surfaces of the structure.

As an example, a seed layer of an electrically conductive material is formed over a set of four or more side surfaces of the substrate. For example the seed layer is formed of an electrically conductive material using an electroless process. One or more magnetic shield layers are formed over the seed layer, namely over four or more contiguous side surfaces of the structure. For example, the magnetic shield layer is formed using an electroplating technology. One or more leads of an electrically conductive material can pass through an unshielded side surface of the structure to carry signals to and from the sensor located therein. In one example, the sensor is a Hall effect sensor and the lead is in the form of a loop located adjacent to the Hall effect sensor such that the magnetic field is created by current flowing through the loop and detected by the Hall effect sensor. The Hall effect sensor may be electrically connected to a circuit to measure the magnetic field and thereby provide an output representative of the current through the lead. Other types of sensors and other numbers of Hall effect sensors may be implemented as may depend on application requirements.

Figure 1:
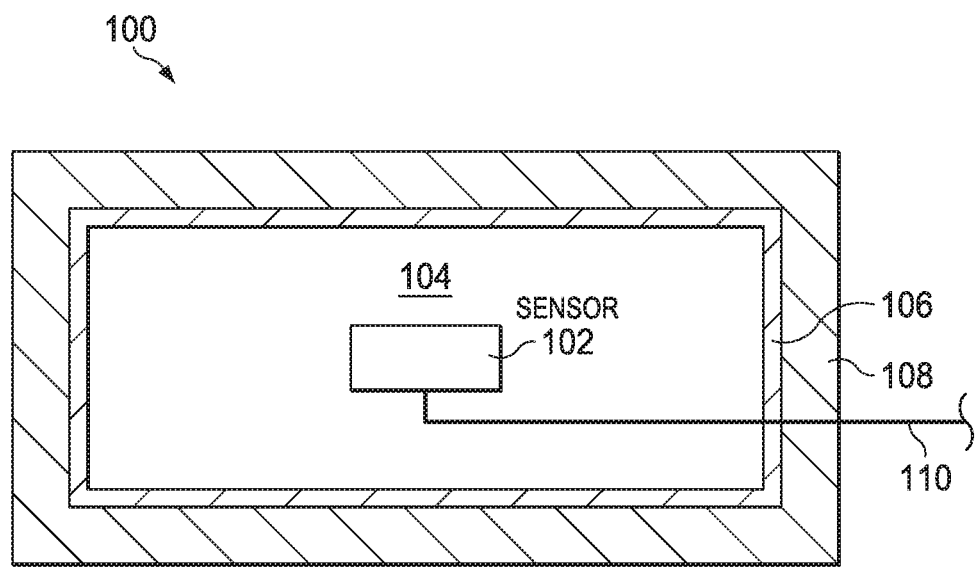
FIG. 1 depicts an example of a structure including a substrate, sensor and a magnetic shield.

FIG. 1 is a partial cross sectional view of an example of a structure 100. The structure 100 includes one or more sensors 102 positioned within a substrate 104. For example, the sensor 102 is implemented on a die that is mounted and fixed to a packaging material, which corresponds to the substrate 104. The substrate 104 thus encapsulates the sensor or sensor die to form a packaged integrated circuit (IC). Examples of plastic packaging materials that may be utilized to form the substrate 104 include thermosetting polymers (e.g., epoxy resins), thermoplastic polymers and the like.

The sensor 102 is configured to detect events or conditions and provide a sensor signal to indicate the detected event or condition. In examples described herein, the sensor is a Hall effect sensor configured to measure the magnitude of a magnetic field and provide an output that is proportional to the measured magnetic field strength. Such Hall effect sensor may be used for proximity sensing, positioning, speed detection and current sensing applications to name a few. For the example in which the sensor 102 is a Hall effect current sensor, the structure 100 includes a lead 110 of an electrically conductive material (e.g., a wire or trace) to propagate electrical current to and from the sensor. As one example, the lead 110 may be in a form of a loop that surrounds an axis of the Hall effect sensor to create a magnetic field based on current flowing through the lead. The sensor 102 and substrate 104 may be implemented as a flip chip IC. Other mounting technologies may be used in other examples.

Each sensor 102 is electrically connected to a circuit (not shown) for measuring the magnetic field. The circuitry may be integrated on the substrate (e.g., within the inter-level dielectric oxide layer) or may be positioned at a distant location (e.g., on another substrate).

As shown in the example of FIG. 1, the structure 100 also includes a seed layer 106 over a number of side surfaces of the substrate 104. The seed layer 106 may be formed of an electrically conductive material through an electroless process, such as described herein. The seed layer 106 may have a thickness along each of the sides of less than about one micrometer (e.g., seed layer thickness <1 μm). In an example, the seed layer 106 is a composition that includes titanium (Ti) tungsten (W), copper (Cu), and combinations thereof The structure 100 also includes a magnetic shield layer 108 of a material having a high magnetic permeability that is formed over the seed layer 106 on four or more contiguous sides of the structure. For example, the magnetic shield layer 108 is a composition that includes nickel (Ni), cobalt (Co), iron (Fe), iron-nickel alloy (NiFe), cobalt-nickel-iron (CoNiFe), cobalt tantalum zirconium alloy (CoTaZr), as well as combinations and alloys thereof. In an example, the magnetic shield layer 108 is formed over the seed layer 106 through an electroplating process, such as described herein. The electroplating process may be controlled to provide the shield layer 108 with a desired thickness (e.g., magnetic shield layer thickness ranging from about 10 μm to about 500 μm). As described herein, the structure 100 may include one or more magnetic shield layers 108.

Figure 2:
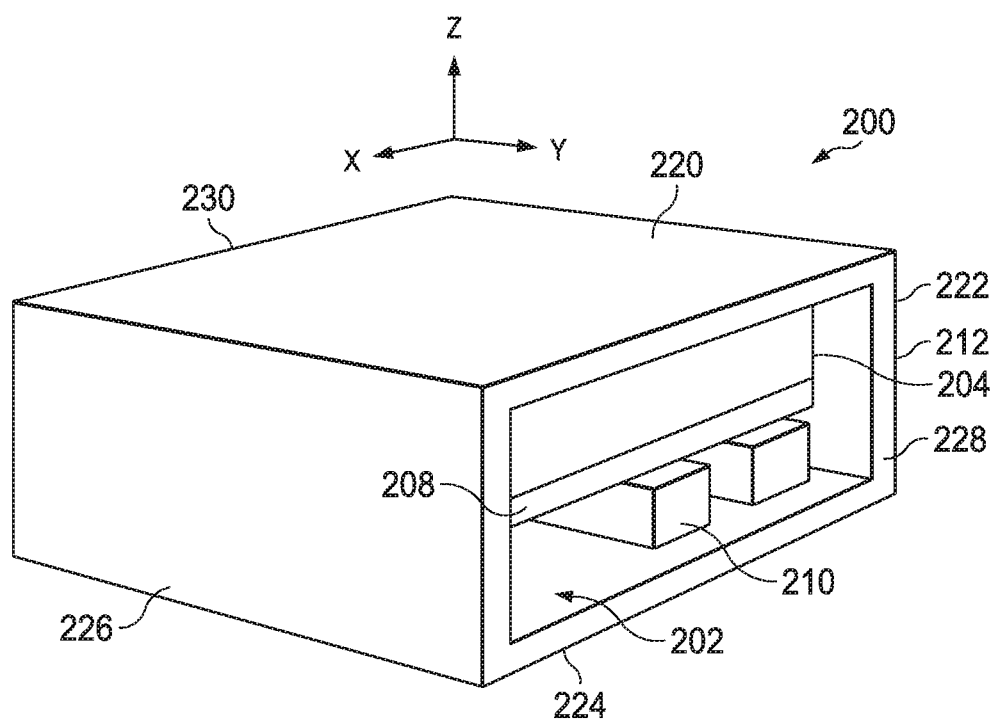
FIG. 2 is an isometric view of a structure including a substrate, sensor and a magnetic shield.
Figure 3:
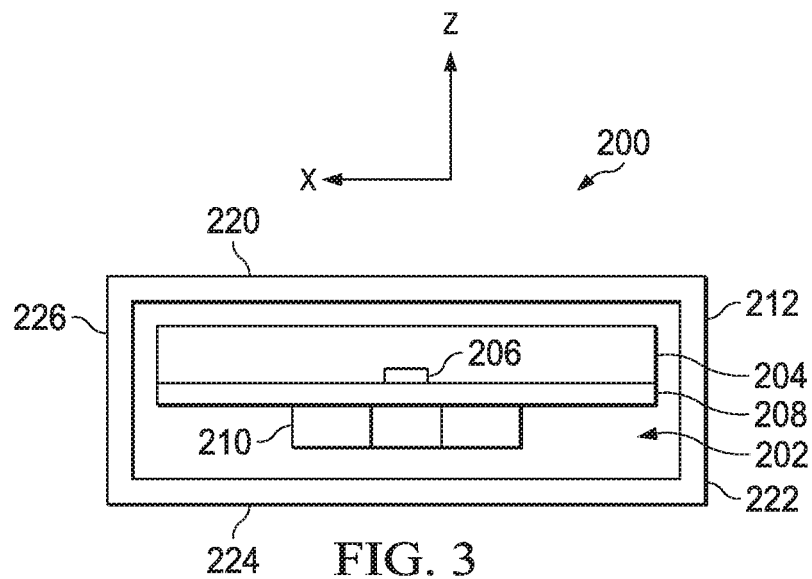
FIG. 3 is a side view of the structure of FIG. 2.
Figure 4:
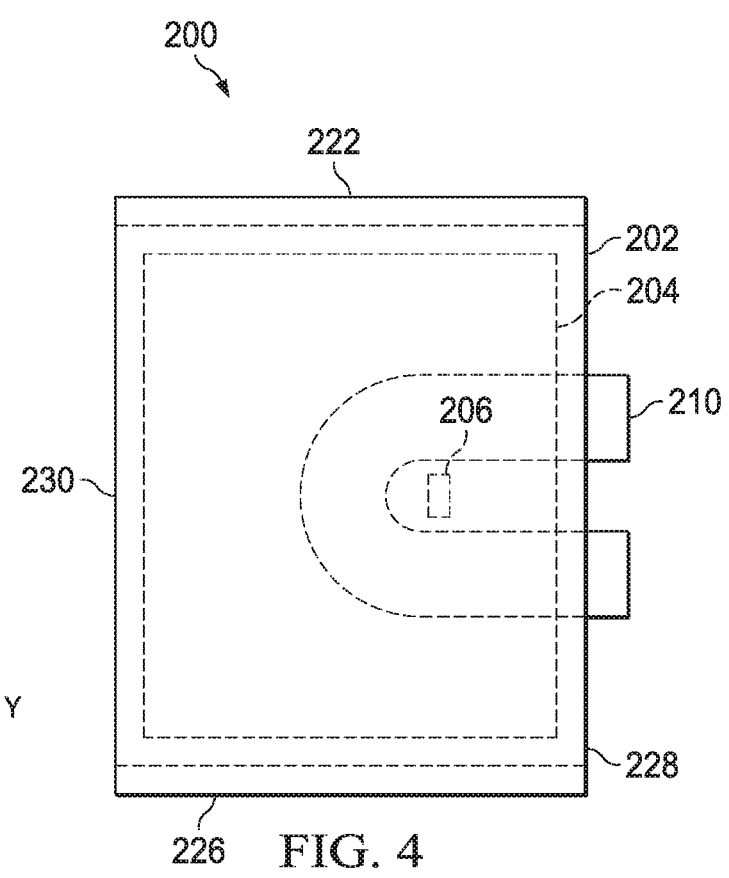
FIG. 4 is a top view of the structure of FIG. 2.

FIGS. 2, 3 and 4 depict different views of a structure 200. FIG. 2 is a perspective view of the structure 200. FIG. 3 is a side view of the structure 200 and FIG. 4 is a top view of the structure. Three-dimensional axes have been labeled x, y and z in each of FIGS. 2, 3 and 4 to provide a basis for the relative alignment of the different views. In the example of FIGS. 2, 3 and 4, the structure 200 has the shape of a rectangular prism having six sides.

The structure 200 includes a substrate 202 of an electrically insulating material. As an example, the substrate 202 encapsulates an IC die 204. The IC die 204 includes one or more sensors 206, such as a Hall effect sensor. The die 204 may be formed on a support structure 208, such as a lead frame. For example, the substrate 202 may be formed of a packaging material (e.g., thermosetting or thermoplastic polymer) to encapsulate the die 204 and lead frame 208 to provide a packaged IC. As one example, the die 204, sensor 206 and lead frame 208 may be implemented in the form of a flip chip package, which tends to reduce the distance (in the Z-direction) between the sensor 206 and the lead.

In the examples of FIGS. 2, 3 and 4, the substrate 202 also encapsulates at least a portion of a lead 210. The lead 210 may be a wire of an electrically conductive material (e.g., copper) that is in the form of a U-shaped loop that is positioned below but around axis of the sensor 206 extending in the z-direction. In this way, and where the sensor 206 is implemented as a Hall effect sensor, current flowing through the loop of the lead 210 creates magnetic flux that provides a magnetic field that is detected as by the Hall effect sensor 206. The Hall effect sensor 206 can convert the magnetic field to an output voltage that is representative of the current in the lead 210.

In the example of FIGS. 2, 3 and 4, the substrate 202 as well as the structure 200 has the shape of a rectangular prism having six sides. The magnetic shield 212 is formed over at least four contiguous sides 220, 222, 224 and 226 of the structure 200. As described herein, the magnetic shield layer 212 may be formed over a seed layer (not shown in FIGS. 2, 3 and 4) that is also formed over the same four or more sides 220, 222, 224 and 226. For example, the magnetic shield layer 212 is a material having high magnetic permeability, such as composition of Ni, Co, Fe, NiFe, CoNiFe, CoTaZr, as well as combinations and other alloys thereof. As shown in FIGS. 2 and 4, the lead 210 includes an input and an output end that extend through a side 228 of the structure 200 that is free of magnetic shielding (e.g., side 228 is unshielded). The side 230 that is opposite side 228 may include a magnetic shield layer or be unshielded.

Figure 5:
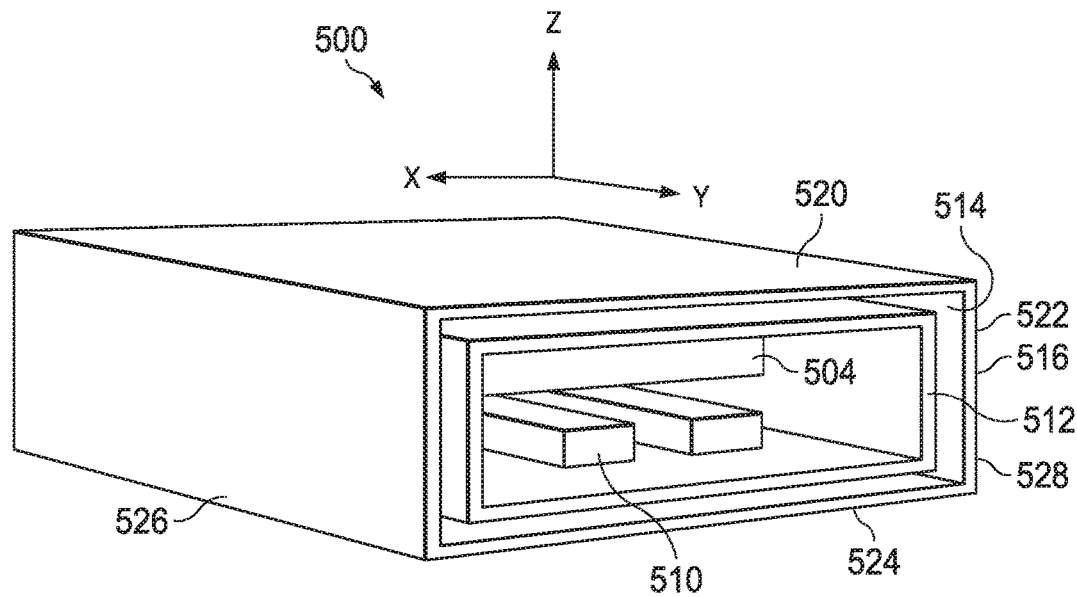
FIG. 5 is an isometric view of a structure including a substrate, sensor and a multi-layer magnetic shield.
Figure 6:
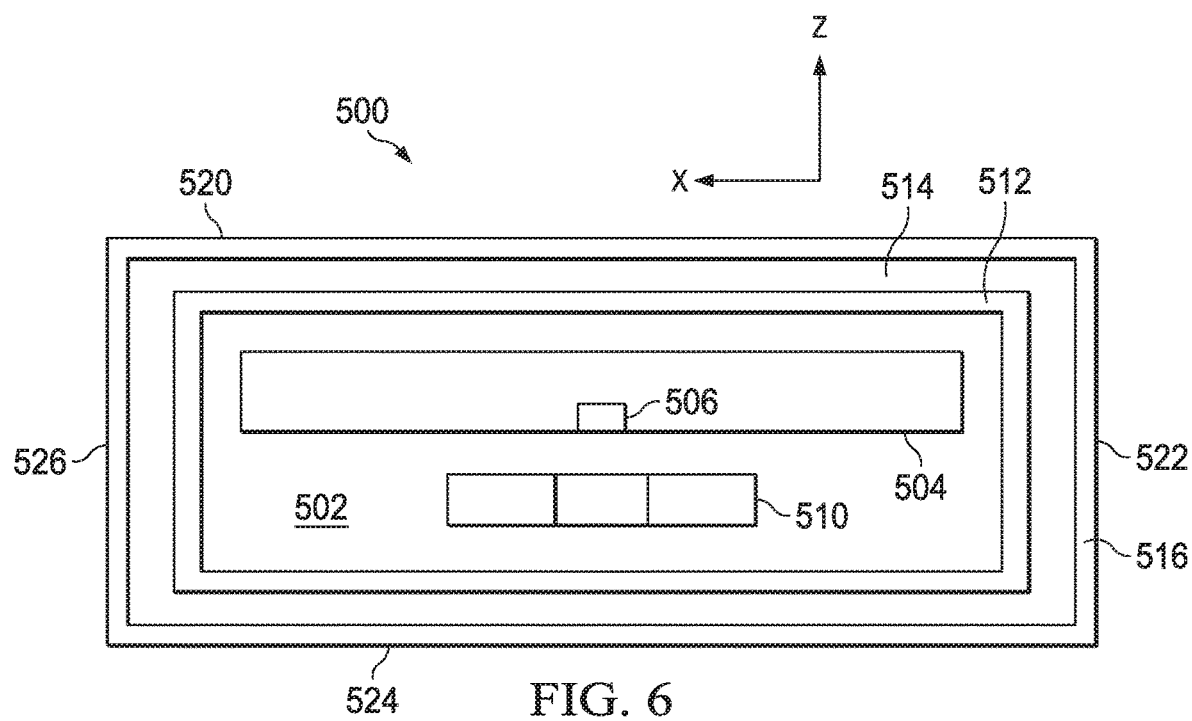
FIG. 6 is a side view of the structure of FIG. 5.

FIGS. 5 and 6 depicting an example of a structure 500 that is similar to the structure 200 of FIGS. 2, 3 and 4. The structure 500 includes a substrate 502 that encapsulates a die 504 having one or more sensors 506. The substrate 502 is an electrically insulating material to encapsulate an IC die 504. In an example, the sensor 506 is implemented as a Hall effect sensor fabricated on the die 504. The die 204 may be on a support structure or be unsupported within the substrate 502.

As in the example of FIGS. 2, 3 and 4, the structure 500 also includes one or more leads (e.g., one or more wires) 510 of an electrically conductive material. The lead 510 may be mounted to the lead frame within the substrate 502 in the form of a U-shaped loop that passes around an axis of the sensor 506 extending in the z-direction. In the examples of FIGS. 5 and 6, one or more sides 528 of the structure 500 is free of magnetic shielding and it is through such side 528 that the ends of the lead 510 extend.

In the examples of FIGS. 5 and 6, the structure 500 includes multiple shield layers 512 and 516. Each of the shield layers 512 and 516 is formed of a material having high magnetic permeability, such as described herein, and each of the layers may include the same or different material. An intermediate separation layer 514 is placed between the shield layers 512 and 516. The separation layer 514 is formed of an electrically insulating material (e.g., a thermosetting or thermoplastic polymer), which may be the same or different material as is used for the substrate 502. Each of the shield layers 512 and 516 is formed over the same four or more side surfaces 520, 522, 524 and 526 of the structure 500. For example, each of the shield layers 512 and 516 is formed over a respective seed layer (not shown) that is formed over the insulating material of the substrate 502 and separation layer 514, respectively.

Figure 7:
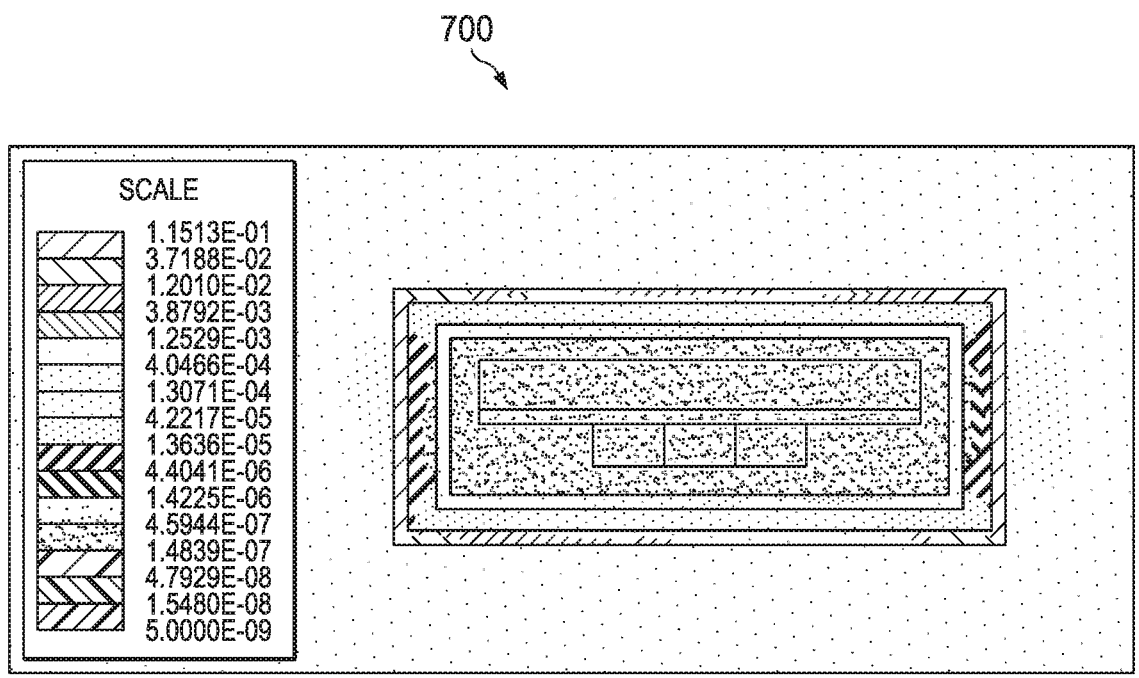
FIG. 7 is a magnetic field distribution along a side view of the structure of FIG. 5.

FIG. 7 depicts an example of magnetic field distribution 700 for the structure 500 of FIGS. 5 and 6. As shown in FIG. 7, the combination of high and low permeability multi-layer structure 500 reduces the stray magnetic field at the sensor. For example, magnetic flux is concentrated in the thin high permeability material layer, which reduces the flux density in the lower permeability material layer of the structure. The flux density is also dependent on distance from the source, such that the flux density in the low permeability material becomes exponentially lower as the distance from the high permeability material increases. Therefore, relatively thick low permeability material gap layer minimizes the flux density at the second high permeability material layer. The closed-loop feature of the structure 500 further reduces field leakage. Additionally, the multiple layer design of the shield provides more grades of attenuation and extends the saturation point, which is much more effective compared with single layer design. Thus, compared to just having the high permeability material with the same thickness as the low permeability layer, the multi-layer approach can reduce the stray field intensity at the sensor by about 100 times. Depending on the specific application, an optimal design may be achieved by adjusting the thickness of each layer including the thickness of the gap layer thickness in between shield layers.

Figure 8:
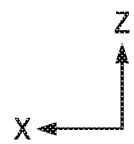
FIG. 8 is a flow diagram depicting an example method for making a shielded structure.
Figure 8:
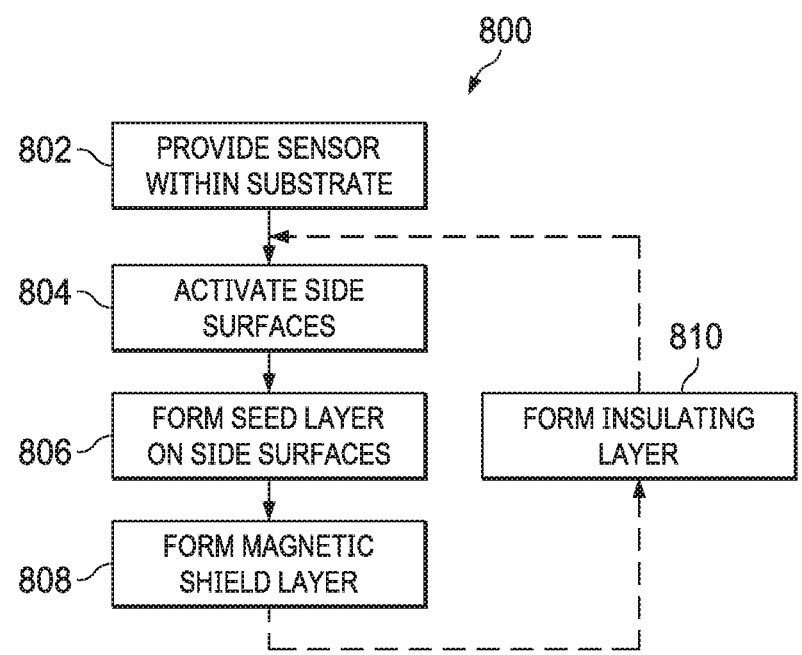

In view of the foregoing structural and functional features described above, example methods will be better appreciated with reference to FIG. 8. FIG. 8 is a flow diagram of a method 800 to make a shielded sensor structure. The method 800 may be used to make any of the structures disclosed herein, including the structure 100 of FIG. 1, the structure 200 of FIGS. 2-4 or the structure 500 of FIGS. 5-6. While, for purposes of explanation, the example method of FIG. 8 is shown and described as executing serially, the method is not limited by the illustrated order, as some actions could in other examples occur in different orders, multiple times and/or concurrently from that shown and described herein. FIG. 8 will be described with respect to FIGS. 9-12 to illustrate examples of the structure throughout the method of its making.

At 802, the method 800 includes providing a sensor that is located within a substrate. The sensor 904 may be placed in the substrate 902 material as part of performing the method 800 or the sensor may be prepackaged within a substrate (e.g., a packaging material) to be provided at 802. That is, the method 800 may be implemented as an extension or part a semiconductor fabrication process in which one or more shield layers are applied to a packaged IC to form a shielded circuit structure (e.g., the structure 100, 200 or 500). Alternatively, the method 800 it is equally applicable to one or more pre-packaged IC, in which one or more die have already been encapsulated in a packaging material (e.g., thermosetting or thermoplastic polymer, such as an epoxy mold compound). This allows some IC chips of the same type to be shielded by the method 800 while another group of the IC chips may remain unshielded. The method also allows existing IC chips to have a magnetic shield applied subsequent to their fabrication.

Figure 9:
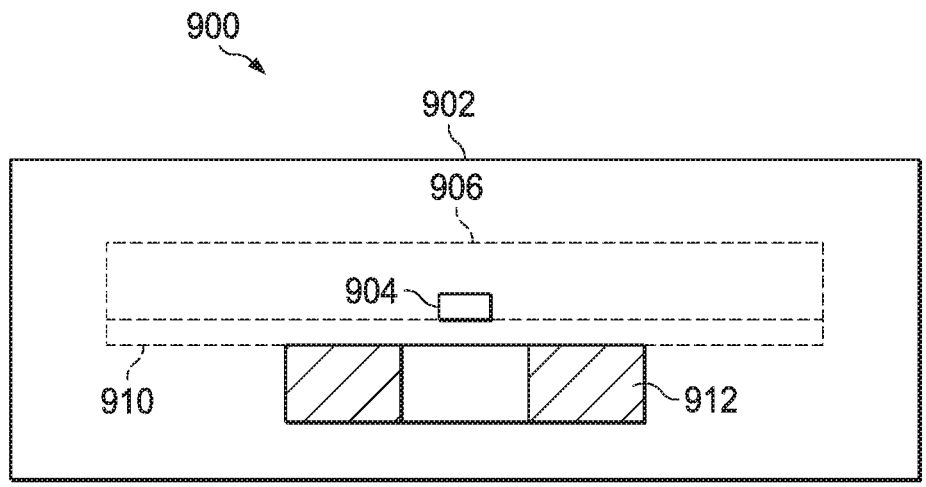
FIG. 9 is a partial cross sectional view of a structure that includes a sensor within a substrate.

FIG. 9 illustrates a partial cross-sectional view of a packaged sensor 900, such as is provided at 802. The packaged sensor 900 includes a sensor 904 fabricated on a die 906. The die 906 may be mounted to a support structure (e.g., lead frame) 910 and a lead 912 may be attached and extend from the lead frame for carrying signals to and from the sensor 904, as described herein.

Figure 10:
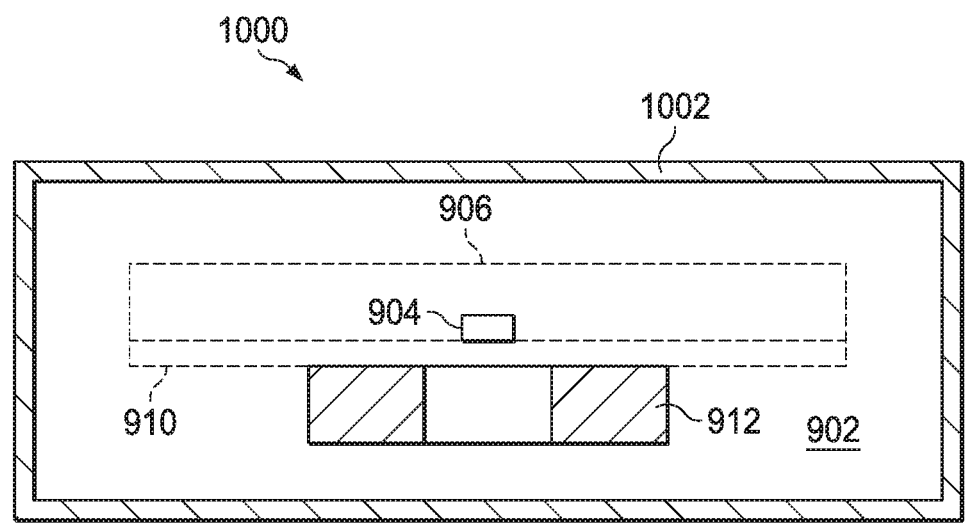
FIG. 10 is a partial cross sectional view of the structure of FIG. 9 after sides of the structure have been activated.

At 804, the method 800 includes activating side surfaces to form the structure 1000 of FIG. 10. FIG. 10 illustrates a partial cross-sectional view of the packaged sensor 900 after the side surfaces activated at 804 to show activated side surfaces 1002 of the resulting structure. For example, four or more side contiguous surfaces over which the magnetic shield layers are to be formed may be activated, demonstrated at 1002, to facilitate formation of a subsequent seed layer (at 806). In one example, a laser may be used to ablate each of the side surfaces to which the shielding is to be applied. As other examples, the side surfaces maybe activated by stressing the surface according to other approaches, which may include patterning, heating, forming grooves, trenching or otherwise mechanically stressing the each of the side surfaces. For example, the surfaces may be mechanically stressed by sanding and pressing the surfaces.

Figure 11:
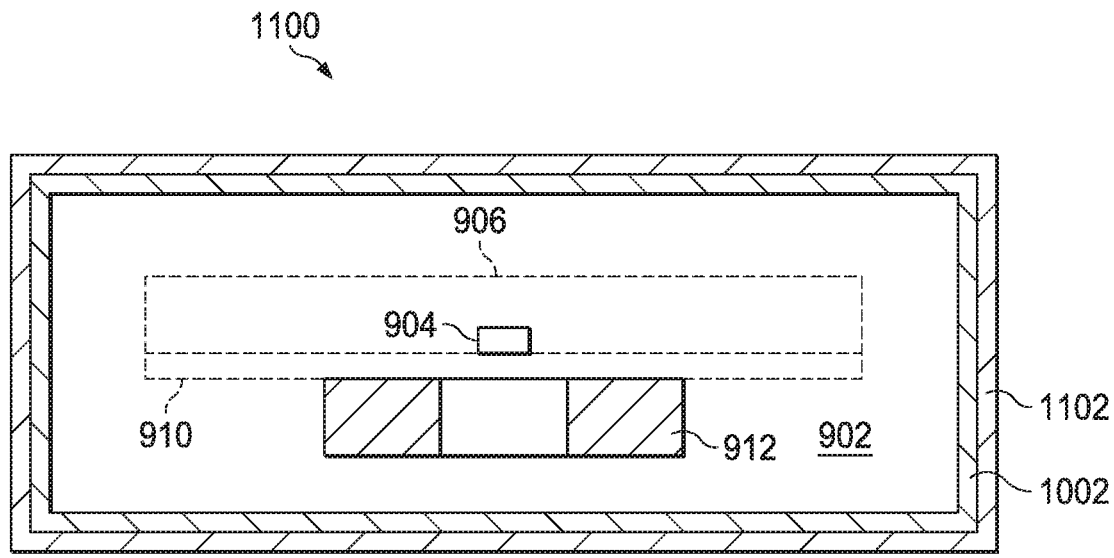
FIG. 11 is a partial cross sectional view of the structure of FIG. 10 after forming a seed layer on the sides of the structure.
Figure 12:
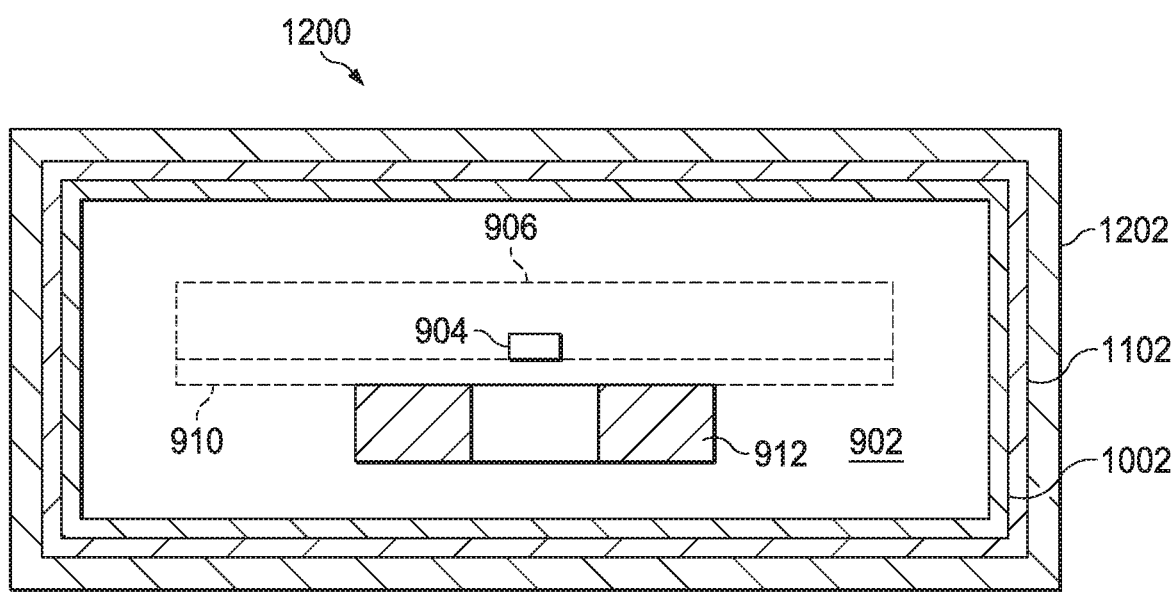
FIG. 12 is a partial cross sectional view of the structure of FIG. 11 after forming a magnetic shield over the seed layer.

At 806, the method 800 includes forming a seed layer over the activated side surfaces, such as to form the structure 1100 of FIG. 11. For example, a seed layer 1102 may be formed on four or more contiguous surfaces that have been activated at 804 using an electroless metallization process to form the structure 1100. As an example, an ionized solution of an electrically conductive material (e.g., Ti, W, Cu) may be applied over the activated side surfaces of the structure 1000 to form the seed layer. For example, the activated packaged structure 1000 is immersed in the ionized solution to form a thin (e.g., less than about 1 μm) seed layer 1102 of electrically conductive material, which may be a composition of Ti, W, Cu and combinations thereof.

The seed layer formed at 806 may be cleaned prior to proceeding in the method 800. At 808, the magnetic shield layer is formed over the seed layer to form a shielded sensor structure, such as the structure 1200 of FIG. 12. In an example, a magnetic shield layer 1202 may be formed at 808 through an electroplating process in which the structure 1100 (FIG. 11) is inserted into an electroplate solution containing one or more dissolved metal salts and/or other ions. Electrical current is applied to the electrical seed layer 1102 through one or more electrodes contacting one or more of the side surfaces to be plated. The seed layer 1102 may itself operate as an electrode during electroplating. The electrical currents applied to the seed layer 1102 form the magnetic shield layer 1202 having a thickness that varies according to the time and/or current that is applied to the seed layer. For example, the magnetic shield layer may be formed of a material having high magnetic permeability (e.g., a composition of Ni, Co, Fe, NiFe, CoNiFe, CoTaZr) and have a thickness ranging from about 10 μm to 500 μm. While electroplating has been described to form the shield layer, other approaches (e.g., electrochemical deposition or sputtering) may be used to form the shield layer.

Once the shield layer has been formed at 808, the method may end. In other examples, such as where multiple shield layers are to be formed, the method may proceed to 810 in which an electrically insulating layer is formed over the shield layer. In an example, the insulating layer may be formed of the same material that is used to form the substrate 902 (as described in 802). After the insulating layer has been applied with an appropriate thickness (e.g., thickness of about 0.1 mm) over the magnetic shield layers, the method 800 returns to 804 to repeat the process of activating the side surfaces at 804, forming the seed layer on the activating side surfaces at 806 and forming another magnetic shield layer at 808. The process may loop between 804 through 810 to form any number of two or more shield layers. After completion a protective overcoat layer may be formed (e.g., through deposition) on the structure 1200.

Figure 13:
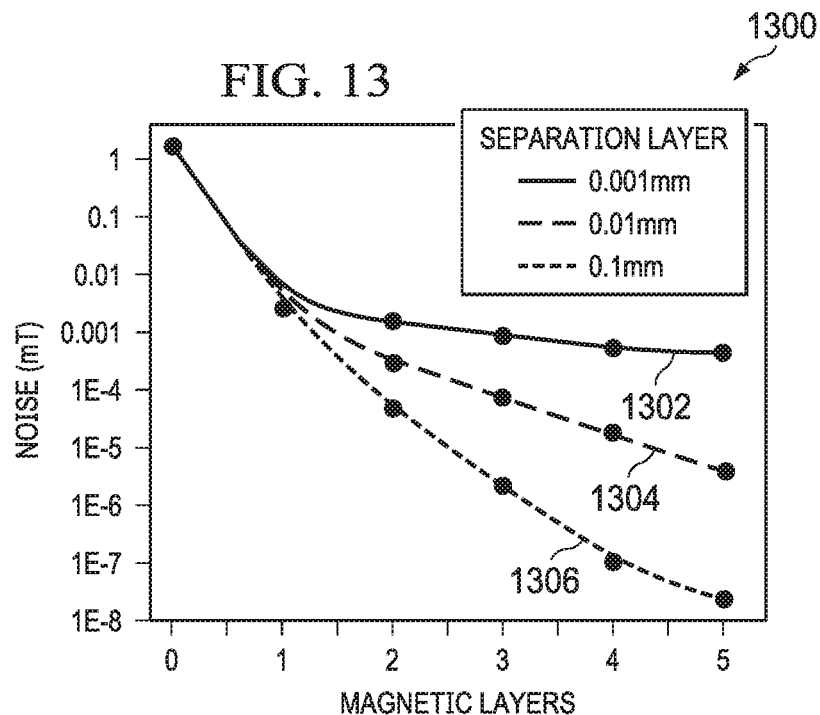
FIG. 13 is a graph plotting noise for a sensor structure as a function of the number of magnetic shield layers.

FIG. 13 is a graph 1300 plotting noise for sensor structures as a function of the number of magnetic shield layers, ranging from zero to five shield layers, and with separation layers of different thicknesses. The graph 1300 includes plots 1302, 1304 and 1306 for multi-layer shields having separation layers with different thicknesses 0.001 mm, 0.01 mm and 0.1 mm, respectively.

Figure 14:
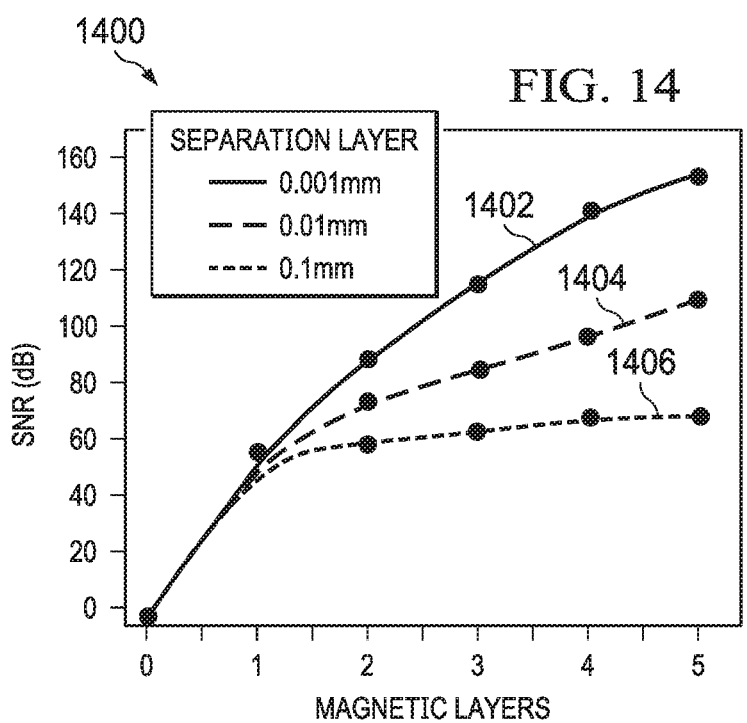
FIG. 14 is a graph depicting the signal to noise ratio for a sensor structure as a function of the number of magnetic shield layers.

FIG. 14 is a graph 1400 depicting the signal-to-noise ratio (SNR) for sensor structures as a function of the number of magnetic shield layers, ranging from zero to five shield layers, and with separation layers of different thicknesses. The graph 1400 includes plots 1402, 1404 and 1406 for multi-layer shields having separation layers with different thicknesses 0.1 mm, 0.01 mm and 0.001 mm, respectively. As shown, a greater number of magnetic shield layers will increase the SNR of the sensor and, when multiple layers are used, a thinner separation layer between magnetic shield layers further enhances SNR.

In this application, the term "couple" or "couples" means either an indirect or direct wired or wireless connection.

Thus, if a first device couples to a second device, that connection may be through a direct connection or through an indirect connection via other devices and connections. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

The recitation "based on" means "based at least in part on." Therefore, if X is based on Y, X may be a function of Y and any number of other factors.

Modifications are possible in the described embodiments, and other embodiments are possible, within the scope of the claims.

What is claimed is:

1. An integrated circuit, comprising:
   a substrate having a substrate surface and including an electrically conductive lead;
   a semiconductor die on the substrate surface, the semiconductor die including a sensor;
   a structure around the semiconductor die and the substrate, in which the structure has six sides, and the conductive lead includes a segment that extends out of a first side of the structure perpendicular to the substrate surface; and
   a magnetic shield layer on external surfaces of second, third, fourth, and fifth sides of the structure.

2. The integrated circuit of claim 1, wherein the magnetic shield layer has a higher magnetic permeability than the structure and configured to concentrate a magnetic flux generated by a current that flows through the conductive lead.

3. The integrated circuit of claim 1, wherein the segment is a first straight segment, and the conductive lead includes a second straight segment that extends out of the first side and a bent segment coupled between the first and second straight segments; and
   the sensor is on a part of the substrate between the first and second straight segments.

4. The integrated circuit of claim 1, further comprising an electrical insulation material that encapsulates the semiconductor die and the substrate, and the structure is around the electrical insulation material.

5. The integrated circuit of claim 1, wherein the magnetic shield layer includes at least one of: nickel, cobalt, iron, an iron-nickel alloy, a cobalt-nickel-iron alloy, or a cobalt-tantalum zirconium alloy.

6. The integrated circuit of claim 1, further comprising a seed layer between the magnetic shield layer and the external surfaces.

7. The integrated circuit of claim 6, wherein the seed layer includes at least one of: titanium, tungsten, or Copper.

8. The integrated circuit of claim 1, wherein the magnetic shield layer is a first magnetic shield layer, the structure is a first structure, and the integrated circuit further comprises a second structure around the first structure; and
   wherein the integrated circuit comprises a second magnetic shield layer on external surfaces of the second structure.

9. The structure of claim 8, further comprising an electrical insulation layer between the first structure and the second structure.

10. A method of forming an integrated circuit, the method comprising:
    mounting a semiconductor die on a substrate surface of a substrate, in which the substrate includes an electrically conductive lead including a segment, and the semiconductor die includes a sensor;
    forming a structure around the semiconductor die and the substrate, in which the structure has six sides, and the segment extends out of a first side of the structure perpendicular to the substrate surface; and
    forming a magnetic shield layer on external surfaces of second, third, fourth, and fifth sides of the structure.

11. The method of claim 10, further comprising encapsulating the semiconductor die and the substrate with an electrical insulation material; and
    wherein forming the structure includes activating surfaces of the electrical insulation material.

12. The method of claim 11, wherein activating the surfaces of the electrical insulation material includes at least one of: ablating the surfaces of the electrical insulation material with laser, patterning the surfaces of the electrical insulation material, heating the surfaces of the electrical insulation material, forming grooves on the surfaces of the electrical insulation material, trenching the surfaces of the electrical insulation material, or mechanically stressing the surfaces of the electrical insulation material.

13. The method of claim 11, wherein forming the magnetic shield layer includes forming a seed layer on the activated surfaces, and forming the magnetic shield layer on the seed layer.

14. The method of claim 13, wherein forming the seed layer includes at least one of: performing an electroless metallization process on the activated surfaces, or applying an ionized solution of an electrically conductive material on the activated surfaces.

15. The method of claim 13, wherein forming the magnetic shield layer on the seed layer includes performing an electroplating process on the seed layer.

16. The method of claim 13, wherein the seed layer includes at least one of: titanium, tungsten, or Copper.

17. The method of claim 13, wherein the magnetic shield layer is a first magnetic shield layer, the structure is a first structure, and the method further comprises:
    forming a second structure around the first structure; and
    forming a second magnetic shield layer on external surfaces of the second structure.

18. The method of claim 17, wherein the seed layer is a first seed layer, and forming the second structure includes:
    forming an insulation layer around the first structure;
    activating surfaces of the insulation layer;
    forming a second seed layer on the activated surfaces of the insulation layer; and
    forming the second magnetic shield layer on the second seed layer.

19. The method of claim 10, wherein the magnetic shield layer includes at least one of: nickel, cobalt, iron, an iron-nickel alloy, a cobalt-nickel-iron alloy, or a cobalt-tantalum zirconium alloy.

20. The method of claim 11, wherein the segment is a first straight segment, the conductive lead includes a second straight segment that extends through the first side and a bent segment coupled between the first and second straight segments; and
    the sensor is on a part of the substrate between the first and second straight segments.

21. The integrated circuit of claim 1, wherein the magnetic shield layer is not on the first side and is on a sixth side opposing the first side.

22. The integrated circuit of claim 1, wherein the sensor includes a Hall sensor.

23. The method of claim 11, further comprising: not forming the magnetic shield layer on the first side, and forming the magnetic shield layer on a sixth side opposing the first side.

24. An integrated circuit, comprising:
- a semiconductor die including a sensor;
- a first structure around the semiconductor die; and
- a first magnetic shield layer on four sides of the first structure;
- a second structure around the first structure, in which the first magnetic shield layer is between the first and second structures; and
- a second magnetic shield layer on four sides of the second structure.

25. The integrated circuit of claim 24, further comprising an electrical insulation layer between the first structure and the second structure.

26. The integrated circuit of claim 24, further comprising a substrate including an electrical conductive lead, wherein the semiconductor die is on the substrate, the first structure is around the semiconductor die and the substrate, and the conductive lead along a surface of the substrate and out of the first and second structures.

27. The integrated circuit of claim 24, wherein the sensor includes a Hall sensor.

* * * * *